United States Patent
Roh

[11] Patent Number: 6,146,932
[45] Date of Patent: Nov. 14, 2000

[54] METHOD FOR FABRICATING METAL-OXIDE-SEMICONDUCTOR FIELD EFFECT TRANSISTOR DEVICE

[75] Inventor: Tae-Hun Roh, Cheongju, Rep. of Korea

[73] Assignee: Hyundai Microelectronics Co., Ltd., Choongcheongbuk-Do, Rep. of Korea

[21] Appl. No.: 09/409,064

[22] Filed: Sep. 30, 1999

[30] Foreign Application Priority Data

Aug. 2, 1999 [KR] Rep. of Korea ........................ 99-31712

[51] Int. Cl.[7] ................................................ H01L 21/8234
[52] U.S. Cl. ........................... 438/197; 438/585; 438/301
[58] Field of Search .................................. 438/197, 238, 438/239, 250, 586, 301, 585

[56] References Cited

U.S. PATENT DOCUMENTS

| | | | |
|---|---|---|---|
| 4,987,098 | 1/1991 | Nishiura et al. | ........................ 437/142 |
| 5,674,782 | 10/1997 | Lee et al. | . |
| 5,753,546 | 5/1998 | Koh et al. | . |
| 5,908,791 | 6/1999 | Han et al. | . |
| 5,956,594 | 9/1999 | Yang et al. | . |
| 5,994,192 | 11/1999 | Chen | . |

*Primary Examiner*—Trung Dang
*Attorney, Agent, or Firm*—Morgan, Lewis & Bockius LLP

[57] ABSTRACT

A method for fabricating a metal-oxide-semiconductor field effect transistor (MOSFET) device, includes: a step of dividing a semiconductor substrate into an active region and an isolation region; a step of forming a first insulation layer on the semiconductor substrate; a step of forming a first polycrystal silicon layer on the first insulation layer; a step of forming a first silicide layer on the first polycrystal silicon layer; a step of forming a second insulation layer on the first silicide layer; a step of patterning the second insulation layer; a step of forming a sidewall spacer at the side portions of the second insulation layer pattern; a step of forming a gate by sequentially etching the first silicide layer, the first polycrystal silicon layer and the first insulation layer by using the second insulation layer pattern and the sidewall spacer as a mask; a step for removing the sidewall spacer; a step of forming an oxide film at the side portions of the gate and at the upper portion of the semiconductor substrate; and a step of sequentially performing a process for forming an impurity region operated as a source/drain at the upper portion of the semiconductor substrate which is adjacent to the gate, thereby providing a stable device property and improving a yield.

15 Claims, 7 Drawing Sheets

6,146,932

METHOD FOR FABRICATING METAL-OXIDE-SEMICONDUCTOR FIELD EFFECT TRANSISTOR DEVICE

BACKGROUND OF THE INVENTION

1. Field of the Invention

The present invention relates to a method for fabricating a semiconductor device, and in particular to a metal-oxide-semiconductor field effect transistor (MOSFET) device.

2. Description of the Background Art

Referring to FIG. 1a, a first insulation layer 5, a first polycrystal silicon layer 7, a first silicide layer 8 and a second insulation layer 10 are sequentially formed on a semiconductor substrate 1 which is divided into an active region A and an isolation region B by a field oxide film 3. Next, an photoetching process using a photoresist film (not shown) is performed thereon, thereby forming a gate 12.

Thereafter, a thermal oxidation process is carried out in order to protect the side portions of the first polycrystal silicon layer 7 and the first silicide layer 8 of the gate 12 which are exposed during the photoetching process. As a result of the thermal oxidation process, a thin oxide film (not shown) is formed at the side portions of the gate 12 and the upper portion of the semiconductor substrate 1.

Here, the first silicide layer 8, the first polycrystal silicon layer 7, the first insulation layer 5 and the second insulation layer have a different thermal expansion coefficient, and thus the first silicide layer 8 is considerably shrunken during a cooling process after the thermal oxidation process, as compared with the first polycrystal silicon layer 7 and the second insulation layer 10, thereby forming a shape as shown in FIG. 1a. Next, an impurity is implanted into the upper portion of the semiconductor substrate 1 which is adjacent to the gate 12 according to a self-aligned process using the gate 12 as a mask, thereby forming a first impurity region 14a and a second impurity region 14b which serve as a source or drain.

As illustrated in FIG. 1b, a third insulation layer 16 consisting of a nitride is formed at the upper and side portions of the gate 12, and the upper portion of the semiconductor substrate 1. Here, the third insulation layer 16 is formed along the winding of the side portions of the gate 12. A fourth insulation layer 18 consisting of an oxide is formed on the third insulation layer 16. As the fourth insulation layer 18 is formed, it raps around and touches itself before completely filling the holes between the gates 12. Accordingly, gaps 20 are formed between the gates 12, as shown in FIG. 1c.

Referring to FIG. 1d, the fourth insulation layer 18 and the third insulation layer 16 are sequentially partially etched in accordance with the photoetching process using a photoresist film (not shown), thereby forming a first contract hole 19 in order for the first impurity region 14a to be exposed. Thereafter, a second polycrystal silicon layer is deposited in the first contact hole 19 and on the fourth insulation layer 18. A storage node contact plug 22 is formed in the first contact hole 19 by performing a chemical mechanical polishing process (CMP) until the upper portion of the fourth insulation layer 18 is exposed. The storage node contact plug 22 serves to electrically connect the first impurity region 14a to a storage node contact (not shown) of a capacitor. A fifth insulation layer 24 is formed on the whole surface of the semiconductor.

As illustrated in FIG. 1e, the fifth insulation layer 24, the fourth insulation layer 18 and the third insulation layer 16 are sequentially partially etched according to the photoetching process using a patterned photoresist film (not shown), thereby forming a contact hole 23 so that the second impurity region 14b can be exposed. Thereafter, a third polycrystal silicon layer 26 and a second silicide layer 28 are sequentially deposited and patterned, thus forming a bit line 30.

In the above-described metal-oxide-semiconductor field effect transistor (MOSFET) device, a path consisting of the gaps 20 between the adjacent gates 12 is formed in a longitudinal direction of the gate 12. Accordingly, after the first and second contact holes 19, 23 are formed at a predetermined portion between the gates 12, when the storage node contact plug 22 or the bit line 30 is formed in the first and second contact hole 19, 23, the polycrystal silicon flows into and fills the path consisting of the gaps.

FIG. 2 is a scanning electron microscope (SEM) photograph showing a state where the polycrystal silicon flows into the path consisting of the gaps. As shown therein, the polycrystal silicon filled in a contact hole 40 flows into and fills the path consisting of the gaps, thereby making adjacent contacts 44a, 44b short.

FIGS. 3a and 3b illustrate a conventional method for overcoming the aforementioned disadvantage.

After the processes as shown in FIGS. 1a to 1c are carried out, as shown in FIG. 3a, the fourth insulation layer 18 and the third insulation layer 16 are sequentially partially etched according to the photoetching process using a photoresist film (not shown), thereby forming the first contact hole 19. A nitride layer is formed in the first contact hole 19 and on the fourth insulation layer 18, and an anisotropic etching process is performed thereon without a mask, thereby forming a sidewall spacer 60a at the side portions of the first contact hole 19. As illustrated in FIG. 3b, in a method for forming the bit line 30, a sidewall spacer 60b is formed at the side portions of the second contact hole 23 according to a process corresponding to the process as shown in FIG. 3a. The sidewall spacer 60a, 60b serves to block an entrance (or an exit) of the path consisting of the gaps, and thus prevent a second polycrystal silicon layer and a third polycrystal silicon layer which are formed according to a succeeding process from flowing into the path.

However, it is difficult to determine the conditions of the anisotropic etching process for forming the sidewall spacer 60. In case the etching process is excessively performed, the sidewall spacer cannot block the entrance (or exit) of the path consisting of the gaps formed at the side portions of the contact hole. To the contrary, when the etching process is deficiently carried out, the nitride layer which is deposited so as to form the sidewall spacer covers the upper portion of the semiconductor substrate 1 which is exposed due to the contact hole. Accordingly, the storage node contact plug 22 or the bit line 30 cannot be contacted with the impurity regions 14a, 14b operated as a source/drain. Even if the conditions of the anisotropic etching process are properly made, and thus the sidewall spacer blocks the entrance (or the exit) of the path consisting of the gaps formed at the side portions of the contact hole, and simultaneously the storage node contact plug 22 or the bit line 30 is contacted with the source/drain regions 14a, 14b, a contact area of the storage node contact plug 22 or the bit line 30 and the source/drain regions 14a, 14b by the sidewall spacer 60a, 60b is decreased, and as a result, a contact resistance is increased.

SUMMARY OF THE INVENTION

Accordingly, it is a primary object of the present invention to provide a method for fabricating a metal-oxidesemiconductor field effect transistor (MOSFET) device which has a stable device property by preventing a short phenomenon between contact units.

It is another object of the present invention to provide a method for fabricating a metal-oxide-semiconductor field effect transistor (MOSFET) device which can reduce a contact resistance and improve an yield by increasing a contact area of a storage node contact plug and s source/ drain region.

In order to achieve the above-described objects of the present invention, there is provided a method for fabricating a metal-oxide-semiconductor field effect transistor (MOSFET) device, including: a step of dividing a semiconductor substrate into an active region and an isolation region; a step of forming a first insulation layer on the semiconductor substrate; a step of forming a first polycrystal silicon layer on the first insulation layer; a step of forming a first silicide layer on the first polycrystal silicon layer; a step of forming a second insulation layer on the first silicide layer; a step of patterning the second insulation layer; a step of forming a sidewall spacer at the side portions of the second insulation layer pattern; a step of forming a gate by sequentially etching the first silicide layer, the first polycrystal silicon layer and the first insulation layer in accordance with a self-aligned process using the second insulation layer pattern and the sidewall spacer as a mask; a step of removing the sidewall spacer; a step of forming an oxide film at the side portions of the gate and on the semiconductor substrate in accordance with a thermal oxidation process; a step of sequentially performing a process for forming a source/drain region at the upper portion of the semiconductor substrate which is adjacent to the gate; a step of forming a fourth insulation layer at the upper and side portions of the gate and at the upper portion of the semiconductor substrate; a step of forming a fifth insulation layer on the fourth insulation layer; a step of forming a first contact hole by sequentially etching the fourth and fifth insulation layers; a step of filling a second polycrystal silicon layer in the first contact hole; a step of forming a sixth insulation layer on the fifth insulation layer; a step of forming a second contact hole by sequentially etching the sixth insulation layer, the fifth insulation layer and the fourth insulation layer; and a step of filling a third polycrystal silicon layer in the second contact hole.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A method for fabricating a metal-oxide-semiconductor field effect transistor (MOSFET) device in accordance with a preferred embodiment of the present invention will now be described with reference to FIGS. 4a to 4g.

Figure 1A:
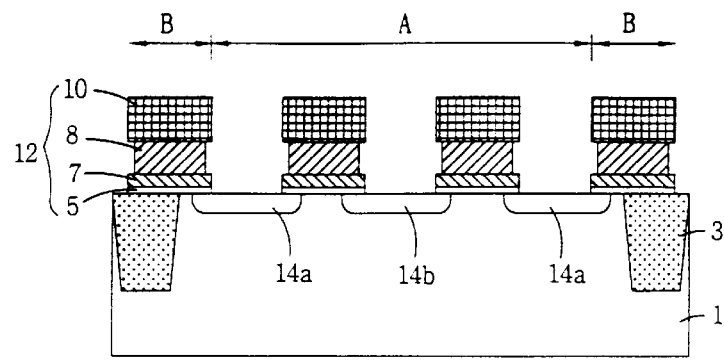
FIGS. 1a to 1e are cross-sectional views illustrating sequential steps of a conventional method for fabricating a metal-oxide-semiconductor field effect transistor (MOSFET) device.
Figure 1B:
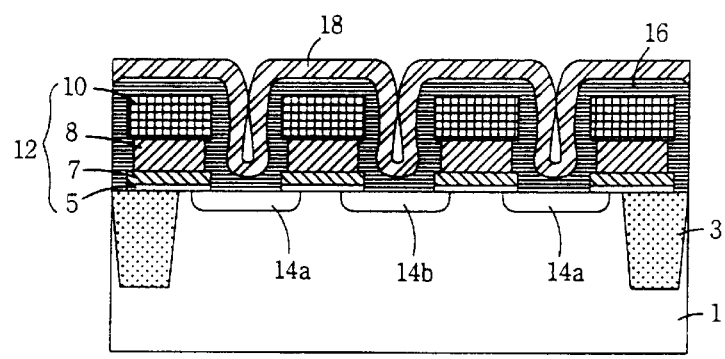
Figure 1C:
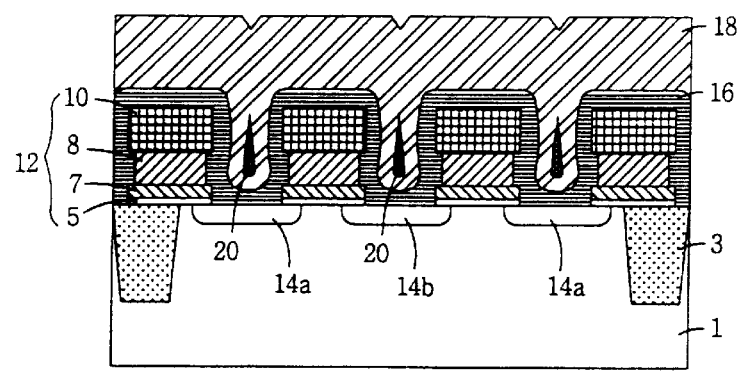
Figure 1D:
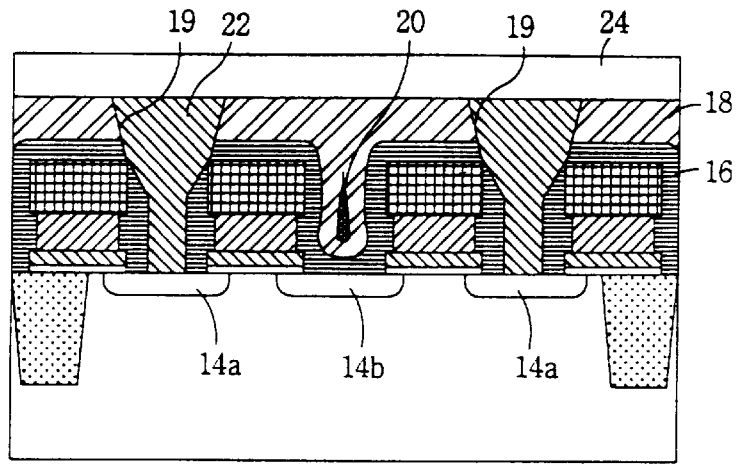
Figure 1E:
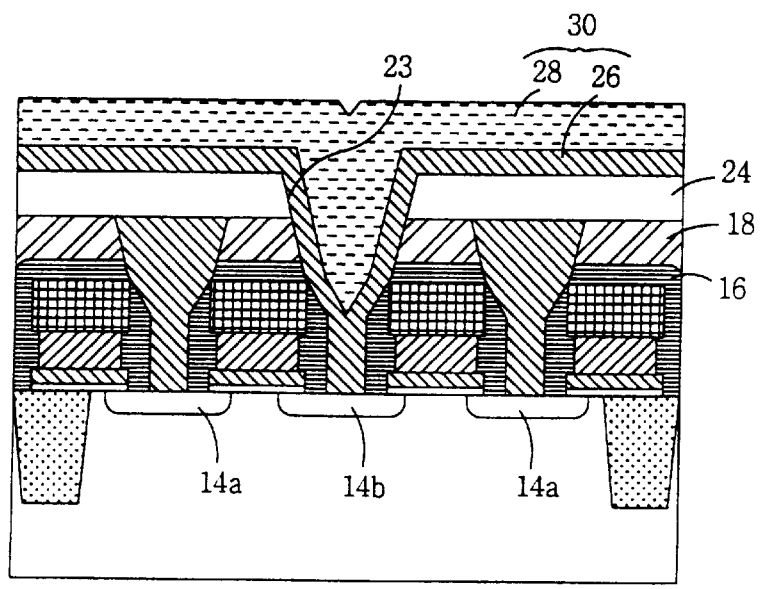
Figure 2:
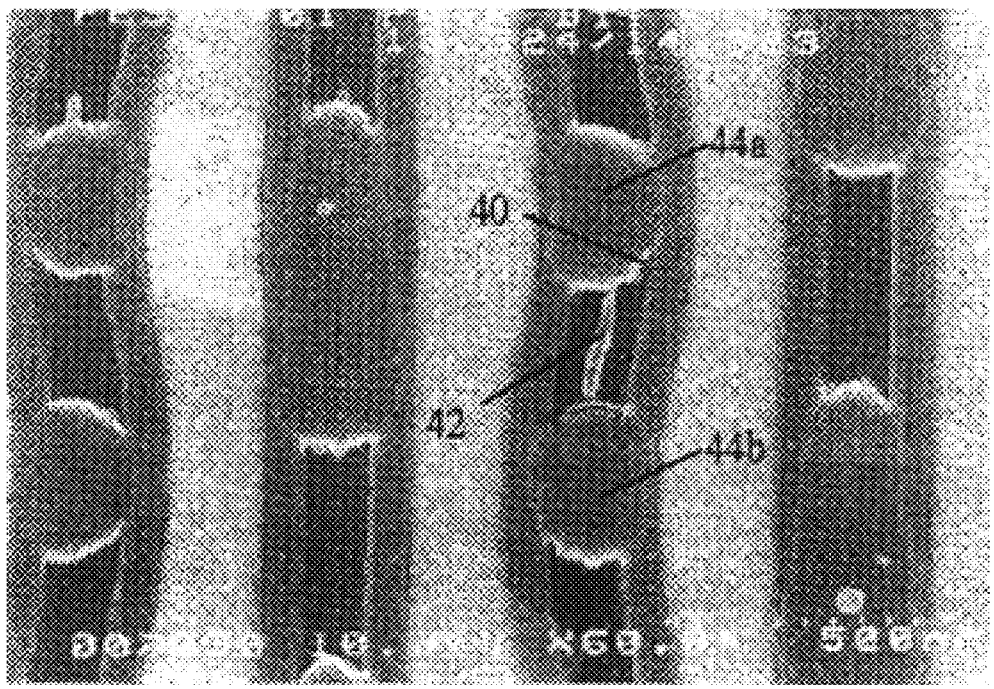
FIG. 2 is a scanning electron microscope photograph showing a cross-section of the MOSFET device according to the conventional fabrication method.
Figure 3A:
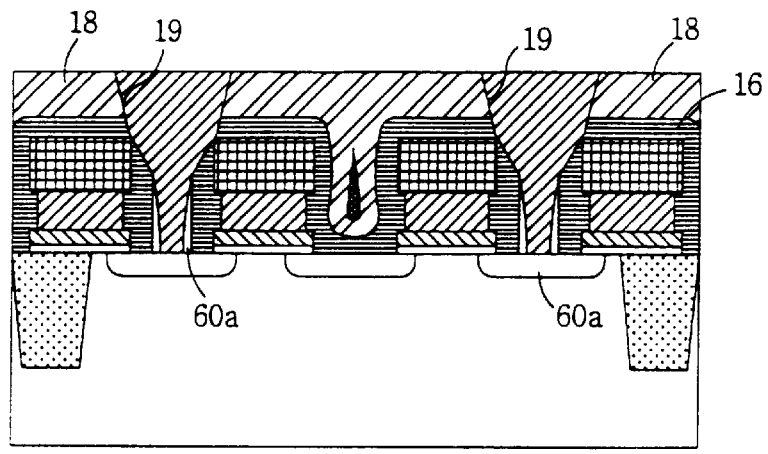
FIGS. 3a and 3b are cross-sectional views illustrating sequential steps of another conventional method for fabricating a metal-oxide-semiconductor field effect transistor (MOSFET) device.
Figure 3B:
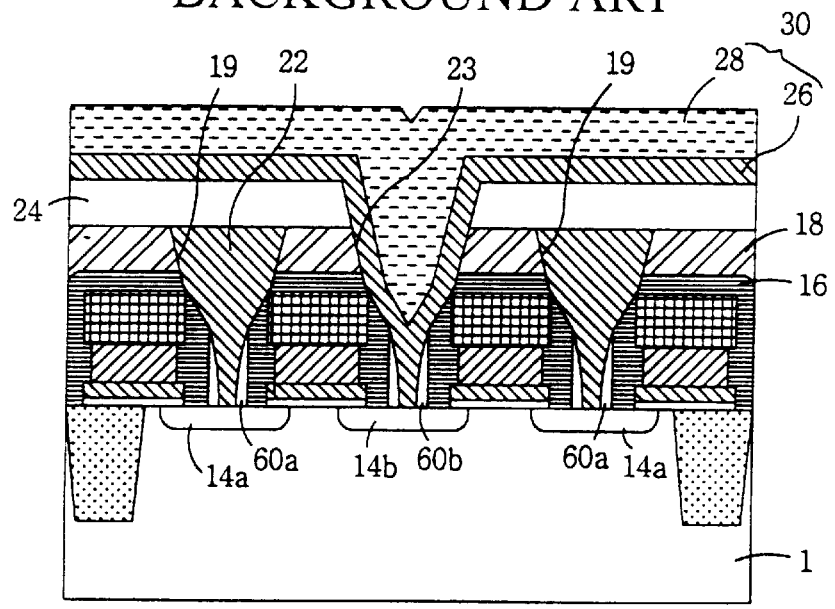
Figure 4A:
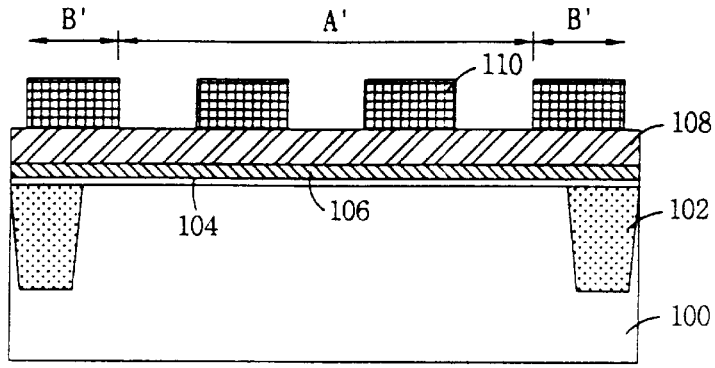
FIGS. 4a to 4g are cross-sectional views illustrating sequential steps of a method for fabricating a metal-oxide-semiconductor field effect transistor (MOSFET) device in accordance with the present invention.

Referring to FIG. 4a, a first insulation layer 104 consisting of an oxide, a first polycrystal silicon layer 106, a first silicide layer 108, and a second insulation layer consisting of a nitride are sequentially formed on a semiconductor substrate 100 which is divided into an active region A' and an isolation region B' by a field oxide film 102. Thereafter, the second insulation layer is photoetched by using a patterned photoresist film (not shown) as a mask, thereby forming a second insulation layer pattern 110.

Figure 4B:
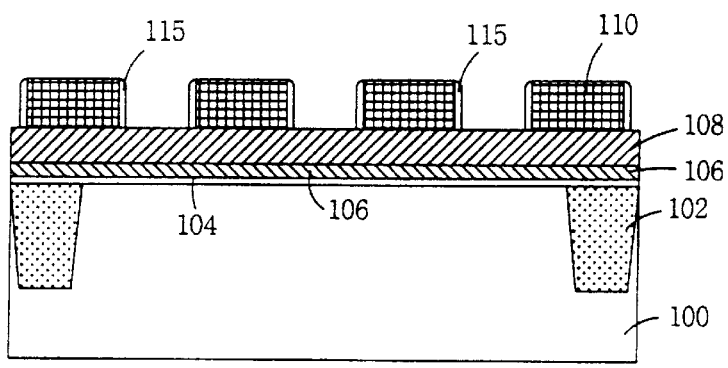

As illustrated in FIG. 4b, a third insulation layer consisting of an oxide is formed on a resultant structure of FIG. 4a. Next, an anisotropic etching process is performed thereon, thereby forming a sidewall spacer 115 at the side portions of the second insulation layer pattern 110. Here, since the first polycrystal silicon layer 106 and the first silicide layer 108 are shrunken after a succeeding thermal process, a width of the sidewall spacer 115 is set wider than a width to be shrunken.

Figure 4C:
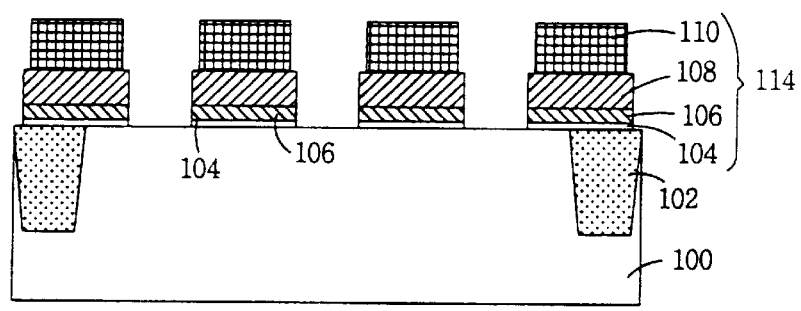

As shown in FIG. 4c, the first silicide layer 108, the first polycrystal silicon layer 106 and the first insulation layer 104 are sequentially partially etched according to a self-aligned process using the second insulation layer pattern 110 and the sidewall spacer 115 as a mask, thereby forming a gate 114. Next, the sidewall spacer 115 at the side portions of the second insulation layer pattern 110 is removed. Here, the second insulation layer pattern 110 and the sidewall spacer 115 consist of different materials.

Figure 4D:
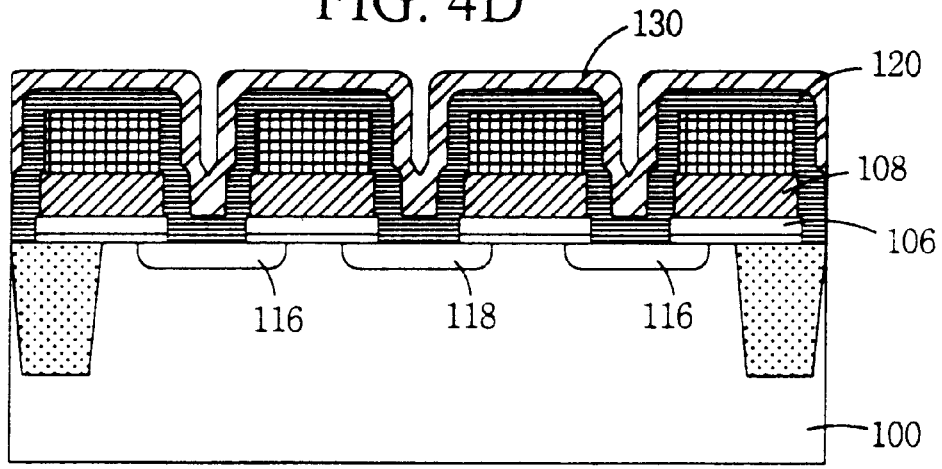

Referring to FIG. 4d, in order to protect the side portions of the first polycrystal silicon layer 106 and the first silicide layer 108 which are exposed during the etching process, a thin oxide film (not shown) is formed at the side portions of the gate 114 and at the upper portion of the semiconductor substrate 100 according to a thermal oxidation process. The first polycrystal silicon layer 106, the first silicide layer 108, the first insulation layer 104 and the second insulation layer 110 which compose the gate 114 are shrunken during a cooling process after the thermal oxidation process. Here, since a shrinkage rate of the first silicide layer 108 is greater than those of the second insulation layer 110 and the first polycrystal silicon layer 106, and a width of the sidewall spacer 115 is greater than that of the first polycrystal silicon layer 106 and the first silicide layer 108 to be shrunken, a width of the second insulation layer 110, the first silicide layer 108 and the first polycrystal silicon layer 106 which compose the gate 114 becomes greater from high to low. Thereafter, an impurity is implanted into the upper portion of the semiconductor substrate 100 which is adjacent to the both side portions of the gate 114 according to the self-aligned process using the gate 114 as a mask, thereby forming a first impurity region 116 and a second impurity region 118 operated as a source/drain.

Figure 4E:
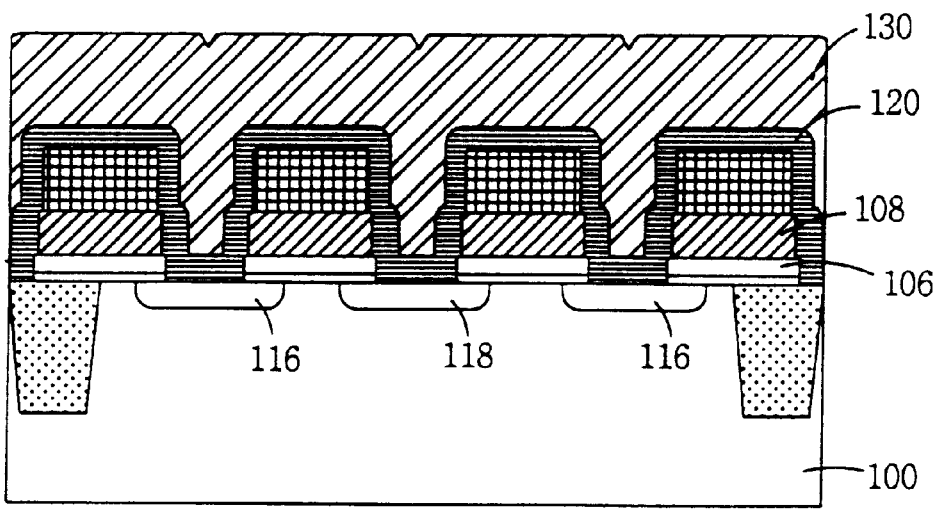

A fourth insulation layer 120 consisting of a nitride is formed at the upper and side portions of the gate 114 and at the upper portion of the semiconductor substrate 100. Here, the fourth insulation layer 120 is formed along the winding of the side portions of the gate 14. Next, a fifth insulation layer 130 such as an oxide is formed on the fourth insulation layer 120. According to the present invention, since a width of the second insulation layer 110, the first silicide layer 108 and the first polycrystal silicon layer 106 which compose the gate 114 becomes greater from high to low, differently from the conventional art, while the fourth insulation layer 120 and the fifth insulation layer 130 are formed, the fifth insulation layer 130 does not touch itself before completely filling holes between the gates 114. As a result, after the fifth insulation layer 130 is formed, as shown in FIG. 4e, gaps are not formed at the lower portion thereof.

Figure 4F:
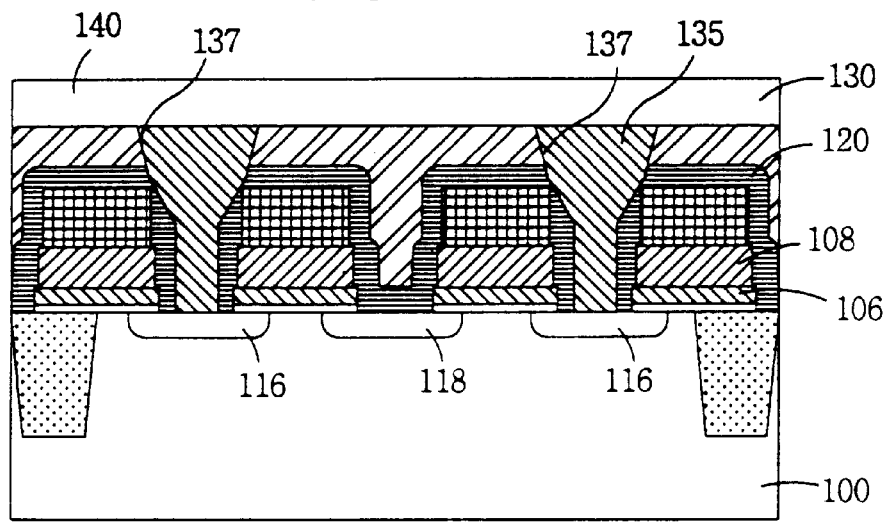

As illustrated in FIG. 4f, the fifth insulation layer 130 and the fourth insulation layer 120 are sequentially etched in accordance with the photoetching process using a patterned photoresist film (not shown) as a mask, thereby forming a first contact hole 137. Thereafter, a second polycrystal silicon layer is deposited thereon, thereby forming a storage node contact plug 135 in order to be contacted with the first impurity region 116. Next, a chemical mechanical polishing (CMP) process is carried out until the upper portion of the fifth insulation layer 130 is exposed. A sixth insulation layer 140 is formed on the entire surface of the semiconductor substrate 100.

Figure 4G:
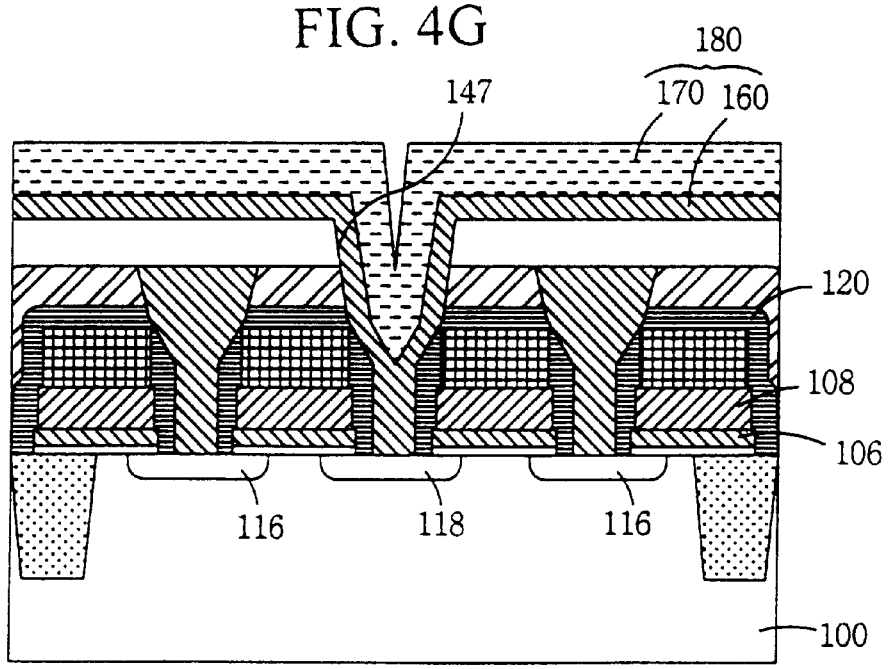

Referring to FIG. 4g, the sixth insulation layer 140, the fifth insulation layer 130 and the fourth insulation layer 120 are sequentially etched according to the photoetching process using a patterned photoresist film (not shown) as a mask, thereby forming a second contact hole 147. Thereafter, a third polycrystal silicon layer 160 and a second silicide layer 170 are deposited, thereby forming a bit line 180 in order to be contacted with the second impurity region 118. Accordingly, fabrication of the MOSFET device in accordance with the present invention is completed. The MOSFET device of the present invention may be a component of a semiconductor memory device.

As discussed earlier, in accordance with the method for fabricating the MOSFET device of the present invention, a width of the gate 114 becomes greater from high to low, the fourth insulation layer 120 formed on the semiconductor substrate 100 including the gate 114 is formed along the winding of the side portions of the gate 114, and thus gaps are not formed when the fourth insulation layer 120 and the fifth insulation layer 130 are formed.

As a result, a short phenomenon does not take place when the storage node contact plug and the bit line are formed in the contact hole, thus improving reliability of fabrication of the MOSFET device.

In addition, since a step of forming the sidewall spacer in the contact hole is omitted, the process for fabricating the MOSFET device is simplified, thereby improving productivity. The present invention overcomes difficulty in determining the anisotropic etching conditions, and thus improves a fabrication yield of the semiconductor device. Also, the contact area of the storage node contact plug 135 or the bit line 180 and the source/drain region is reduced due to the sidewall spacer in the contact hole, thereby reducing a contact resistance.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a metal-oxide-semiconductor field effect transistor (MOSFET) device, comprising:

a step for dividing a semiconductor substrate into an active region and an isolation region;

a step for forming a first insulation layer on the semiconductor substrate;

a step for forming a first polycrystal silicon layer on the first insulation layer;

a step for forming a first silicide layer on the first polycrystal silicon layer;

a step for forming a second insulation layer on the first silicide layer;

a step for patterning the second insulation layer;

a step for forming a sidewall spacer at the side portions of the second insulation layer pattern;

a step for forming a gate by sequentially etching the first silicide layer, the first polycrystal silicon layer and the first insulation layer;

a step for removing the sidewall spacer;

a step for forming an oxide film at the side portions of the gate and at the upper portion of the semiconductor substrate; and a step for sequentially performing a process for forming a source/drain region at the upper portion of the semiconductor substrate which is adjacent to both side portions of the gate.

2. The method according to claim 1, wherein the first insulation layer consists of an oxide.

3. The method according to claim 1, wherein the second insulation layer has a lower thermal expansion and shrinkage rate than the first polycrystal silicon layer and the first silicide layer.

4. The method according to claim 1, wherein patterning of the second insulation layer is performed in accordance with a photoetching process forming a photoresist film on the second insulation layer corresponding to the upper portion of the gate and using it as a mask.

5. The method according to claim 1, wherein the sidewall spacer is formed by patterning the second insulation layer, forming a third insulation layer on an entire structure of the semiconductor substrate, and performing an anisotropic etching process on the third insulation layer without using a mask.

6. The method according to claim 5, wherein the sidewall spacer consists of a material different from the second insulation layer.

7. The method according to claim 5, wherein a width of the sidewall spacer is greater than a width of the first polycrystal silicon layer and the first silicide layer to be shrunken after the step for forming the thermal oxide film.

8. The method according to claim 1, wherein the step for forming the gate by sequentially etching the first silicide layer, the first polycrystal silicon layer and the first insulation layer is performed in accordance with a self-aligned process using the second insulation layer pattern and the sidewall spacer as a mask.

9. The method according to claim 1, further comprising:

a step for forming a fourth insulation layer at the upper and side portions of the gate and at the upper portion of the semiconductor substrate, after forming the source/drain region;

a step for forming a fifth insulation layer on the fourth insulation layer;

a step for forming a first contact hole in order to expose a first impurity region by sequentially partially etching the fourth and fifth insulation layers;

a step for filling a second polycrystal silicon layer in the first contact hole;

a step for forming a sixth insulation layer on the fifth insulation layer;

a step for forming a second contact hole in order to expose a second impurity region by sequentially partially etching the sixth insulation layer, the fifth insulation layer and the fourth insulation layer; and a step for filling a third polycrystal silicon layer in the second contact hole.

10. The method according to claim 9, wherein the fourth insulation layer consists of a nitride.

11. The method according to claim 9, wherein the fifth insulation layer consists of an oxide.

12. The method according to claim 9, wherein the sixth insulation layer consists of an oxide.

13. The method according to claim 9, further comprising a step for forming a second silicide layer on the third polycrystal silicon layer.

14. The method according to claim 1, wherein the sidewall spacer consists of a material different from the second insulation layer.

15. The method according to claim 1, wherein a width of the sidewall spacer is greater than a width of the first polycrystal silicon layer and the first silicide layer to be shrunken after the step for forming the thermal oxide film.

* * * * *